United States Patent [19]
Usami

[11] Patent Number: 5,698,995
[45] Date of Patent: Dec. 16, 1997

[54] CLOCK SIGNAL GENERATOR AND INTEGRATED CIRCUIT INCLUDING THE CLOCK SIGNAL GENERATOR

[75] Inventor: Kimiyoshi Usami, Yokohama, Japan

[73] Assignee: Kabushiki Kaisha Toshiba, Kawasaki, Japan

[21] Appl. No.: 636,908

[22] Filed: Apr. 22, 1996

Related U.S. Application Data

[63] Continuation of Ser. No. 154,109, Nov. 18, 1993, abandoned.

[30] Foreign Application Priority Data

Nov. 18, 1992 [JP] Japan .................. P04-308693

[51] Int. Cl.$^6$ .................. H03K 7/08; G11C 7/00
[52] U.S. Cl. .................. 326/93; 365/203; 365/233; 327/175
[58] Field of Search .................. 328/58; 307/265, 307/269, 480, 481; 365/203, 233; 327/172, 175, 142; 326/95, 98, 93

[56] References Cited

U.S. PATENT DOCUMENTS

| | | | |
|---|---|---|---|
| 4,979,194 | 12/1990 | Kawano | 377/55 |
| 5,008,563 | 4/1991 | Kenney et al. | 307/269 |
| 5,054,002 | 10/1991 | Ninomiya et al. | 365/233 |
| 5,059,818 | 10/1991 | Witt et al. | 307/269 |
| 5,133,064 | 7/1992 | Hotta et al. | 395/550 |
| 5,276,586 | 1/1994 | Norsworthy et al. | 395/550 |
| 5,315,164 | 5/1994 | Broughton | 307/265 |
| 5,335,206 | 8/1994 | Kawamoto | 365/233.5 |

*Primary Examiner*—Edward P. Westin
*Assistant Examiner*—Benjamin D. Driscoll
*Attorney, Agent, or Firm*—Foley & Lardner

[57] ABSTRACT

A clock signal generator inputs a main system clock signal and timing signals to indicate optimum timings for selecting and outputting data, respectively, in an integrated circuit to be accessed which performs based on a specified clock signal with respect to the main clock signal. The clock signal generator outputs clock signals having different duty ratios of the main clock signal according to the timing signals for a precharge operation and a readout operation for the integrated circuit. A precharge type integrated circuit including the clock signal generator outputs data therein correctly according to an address signal and the timing signals from the clock signal generator.

13 Claims, 13 Drawing Sheets

ADRTIM=0

ADRTIM=1

5,698,995

CLOCK SIGNAL GENERATOR AND INTEGRATED CIRCUIT INCLUDING THE CLOCK SIGNAL GENERATOR

This application is a continuation of application Ser. No. 08/154,109, filed Nov. 18, 1993, abandoned.

TECHNICAL FIELD

The present invention relates to precharge type integrated circuits such as precharge type RAMs, precharge type ROMs, precharge type logic circuits, and a clock signal generation circuit (or a clock signal generator) for generating clock signals used for the precharge type integrated circuits, and in particularly, to a precharge type integrated circuit used for a macro cell circuit in a microprocessor, a digital signal processor (DSP),and a hard macro cell for a application specific integrated circuit (ASIC).

BACKGROUND ART

In conventional precharge type integrated circuits, for example, precharge operation is executed during the high level of a clock signal (or the low level of the clock signal), and read-out operation (namely, a discharge operation or operation for keeping dynamically the high level) during the low level of the clock signal (or the high level of the clock signal).

FIG. 1 is a circuit diagram of the configuration of a conventional precharge type RAM. FIG. 2 is a circuit diagram of an actual internal circuit of a memory cell (MC) which is one of the configuration elements in the precharge type integrated circuit shown in FIG. 1.

The precharge type integrated circuit shown in FIG. 1 consists of an address decoder 51, AND gates 52 connected to word lines (WL0, WL1, ... ), precharge transistors 53 connected to bit lines (BIT0, inverted BIT1, BIT2, inverted BIT2, ... ), a memory array 54, a sense amplifier 55, a clock buffer for the RAM driven by a main clock signal of a processor, and an inverter 57 for inverting the output signal (CLK) provided from the clock buffer 58.

Next, we will describe an operation of the precharge type RAM having the configuration shown in FIG. 1.

First, the precharge transistors 53 are in ON state at a specified time during the high level of the clock signal CLK. At the same time, all of the word lines WL0, WL1, ... are in the low level and the bit lines BIT0, inverted BIT0, ... are precharged into the high level. During the period, or while the clock signal CLK is in the high level, an address input from external device such as a processor (not shown) becomes effective, then the operation of the address decoder 51 is completed.

Next, when the clock signal CLK is in the low level, the decoded result as the output from the address decoder 51 is transferred directly to the word lines WL0, WL1, .... Specifically, selected word line is only in the high level.

During the period, or while the clock signal CLK is in the low level, the precharge transistors 53 is in OFF state.

For example, the word line WL0 is in the high level to be selected, and when data of the high level is stored in the memory cell "00", (actually, the node 1 is in the high level shown in FIG. 2), the bit line BIT0 is kept in the high level.

On the other hand, electric charges on the bit line BIT0 flow into the memory cell for discharging because the node 2 in the memory cell is in the low level, as shown in FIG. 2. As a result, the bit line BIT0 becomes the low level. The change of the electrical potential of the bit lines BIT0 and BIT1 is transferred to the sense amplifier 55 for amplification, then read out it as the data output.

Specks indicating a time $t_1$ to permit an address input to the address decoder 51 and a time $t_2$ to permit data output from the RAM are provided to the precharge type RAM shown in FIG. 1 when the precharge type RAM is accessed.

For example, we will discuss a case including two following specks (1) and (2):

(1) As shown in FIG. 3A, an address can be read correctly at the time $t_1$ after the clock signal CLK is in the high level, data from the RAM is permitted to output it at the time $t_2$ after the clock signal CLK becomes the low level. In this case adequate time is given for the address decode operation and the data readout operation; and (2) As shown in FIG. 3B, an address can be read correctly at the late time $t_3$ after the clock signal CLK is in the high level, data from the RAM is permitted to output it at the more late time $t_4$ after the clock signal CLK becomes the low level. In this case serious time is given for the address decode operation and adequate time is given to the data readout operation.

Here, the precharge type RAM satisfies narrowly to execute the speck (1) above in performance of this RAM, but, the address decode operation in the precharge type RAM cannot be executed by this timing described above because it cannot be completed during the time $t_3$ to the rising edge of the clock signal CLK.

There is a case where both of the specks (1) and (2) described above are required for the precharge type RAM. We will now explain this below.

As shown in FIG. 4, there also is the case described above that both of a path A and a path B are caused as a critical path according to inner condition of a control logic 58. In the path A, an address data is produced by a flip-flop (F/F) 59 through a logic gate 60 and a selector 61, and data output from the RAM 66 is stored into a F/F 65 through a bus driver 62, a bus 63, and a logic gate 64.

A timing speck for this path A is the speck A shown in FIG. 3A because the path A does not have a plural number of logic circuits from the F/F 59 to the RAM 66 and from the RAM 66 to the F/F 65.

On the contrary, in the path B, an address is generated by the F/F 66 through the logic gates 67 and the selector 61, and the data output from the RAM is transferred to the F/F 68 without delay.

A timing speck for this path B is the speck B shown in FIG. 3B because the path B has a plural number of logic circuits from the F/F 59 to the RAM 66 and a small number of logic circuits from the RAM 66 to the F/F 68.

In order to satisfy the specks (1) and (2) at the same time and to avoid the conventional problem described above in one precharge type RAM 66, there is a conventional method in which the speed of the address decode operation is further increased.

However, specifically, in order to increase the address decode speed in the RAM when the number of words of the RAM is increased, the size of the hardware of the RAM is larger and the configuration of a circuit is complicated.

On the other hand, there is a conventional method for satisfying both of the specks (1) and (2) at the same time with a pair of RAMs. However, in this case the hardware cost for the RAMs is increased.

SUMMARY OF THE INVENTION

Accordingly, an object of the present invention is to provide, with due consideration to the drawbacks of such conventional devices, a clock signal generator and a precharge type integrated circuit including the clock signal generator.

The clock signal generator generates clock signals to indicate timing periods for a precharge operation including timings to indicate data selection (or data addressing) timing and output timing for data to be accessed in precharge or discharge type integrated devices.

One aspect of the present invention is a clock signal generator for Inputting a main clock signal and timing signals to indicate optimum timings for selecting and outputting data in an Integrated circuit which performs based on a specified clock signal with respect to the main clock signal, and then outputting clock signals having different duty rates of the main clock signal according to the timing signals input.

Another aspect of the present invention is a clock signal generator, comprising:

first inverter means for inputting a main clock signal and outputting an inverted main clock signal;

logical add means (OR means) for inputting the main clock signal and a timing signal indicating an optimum timing of a clock signal to select and output data in a precharge type integrated circuit which performs a precharge operation based on the clock signal with respect to the main clock signal;

a field effect transistor for operating based on output from said OR means, connected between said first inverter means and a power source; and second inverter means for inputting the output of said first inverter means and outputting an inverted output of said first inverter means, having a different duty rate against the duty rate of the main clock signal according to the timing signal.

In addition, another aspect of the present invention is a clock signal generator, comprising:

first inverter means for inputting a main clock signal and outputting an inverted main clock signal;

logical add means (OR means) for inputting the main clock signal and a first timing signal indicating an optimum timing of a clock signal, the optimum timing obtained while the main clock signal is in a high level, to select and output data in a precharge type integrated circuit which performs a precharge operation based on the clock signal;

a field effect transistor for operating based on output from said OR means, connected between said first inverter means and a high level power source;

third inverter means for inputting a second timing signal indicating an optimum timing of a clock signal, the optimum timing obtained while the main clock signal is in a low level, to select and output data in the precharge type integrated circuit which performs the precharge operation based on the clock signal, and then outputting the inverted second timing signal;

logical product means (AND means) for inputting the main clock signal and the output from the third inverter means; and second inverter means for inputting the output of said first inverter means and outputting the inverted output of said first inverter means, having a different duty rate against the duty rate of the main clock signal according to the first and second timing signal. A precharge type integrated circuit as another aspect of the present invention, comprises:

clock signal generator means for inputting a main clock signal and timing signals to indicate optimum timings for selecting and outputting data in an integrated circuit which performs based on a specified clock signal with respect to the main clock signal, and then outputting clock signals having different duty rates of the main clock signal according to the timing signals input; and precharge type memory means for inputting an address signal and the output from said clock generator means, in which a precharge operation is executed during a high level period or a low level period in the first half of the clock signal transferred from said clock generator means, and a readout operation of data in said memory means selected by the address signal during a low level period or a high level period of the latter half of the clock signal.

Another aspect of the present invention is a precharge type integrated circuit, comprising:

clock signal generator means for inputting a main clock signal and timing signals to indicate optimum timings for selecting and outputting data in an integrated circuit which performs based on a specified clock signal with respect to the main clock signal, and then outputting clock signals having different duty rates of the main clock signal according to the timing signals input; and precharge type logical means for inputting data and the output from said clock generator means, in which a precharge operation is executed during a high level period or a low level period in the first half of the clock signal transferred from said clock signal generator means, and a readout operation of data in said logical means based on the input data during a low level period or a high level period of the latter half of the clock signal.

BRIEF DESCRIPTION OF THE DRAWINGS

These and other objects, features and advantages of the invention will be apparent from the following detailed description of a preferred embodiment of the present invention as illustrated in the accompanying drawings of which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

We will describe preferred embodiments according to the present invention below.

Figure 5:
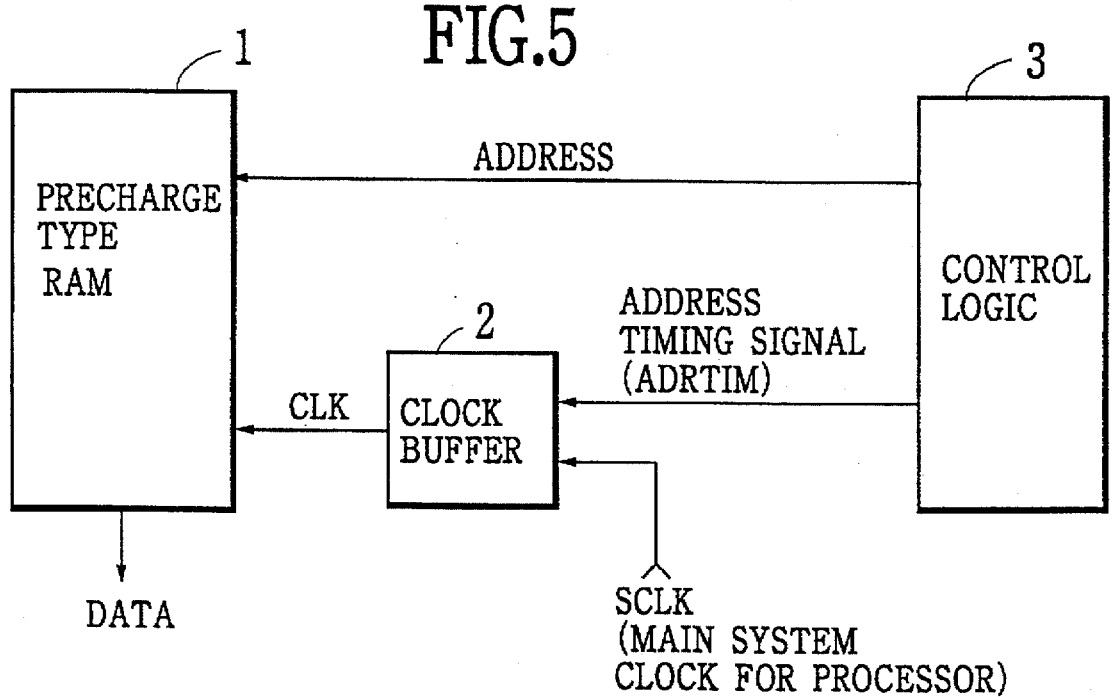
FIG. 5 is a block diagram of a precharge type integrated circuit as an embodiment according to the present invention.

FIG. 5 is a block diagram of a configuration diagram of a precharge type integrated circuit as a first embodiment of the present invention.

In FIG. 5, a precharge type RAM is drawn as the precharge type integrated circuit.

In the precharge type RAM shown in FIG. 5, a precharge type RAM 1 inputs a clock signal CLK transferred from a clock buffer 2 as a clock signal generator 2 in order to execute a precharge operation and a readout operation of the RAM 1. The clock buffer 2 generates a signal for selecting to output data from the RAM 1, namely a signal (ADRTIM) indicating a address timing transferred from a control logic circuit 3 which outputs an address signal when the precharge type integrated circuit is a RAM, and a clock signal (CLK), which is a main clock signal, made by a main system clock (SCLK) signal of a processor (not shown).

Figure 1:
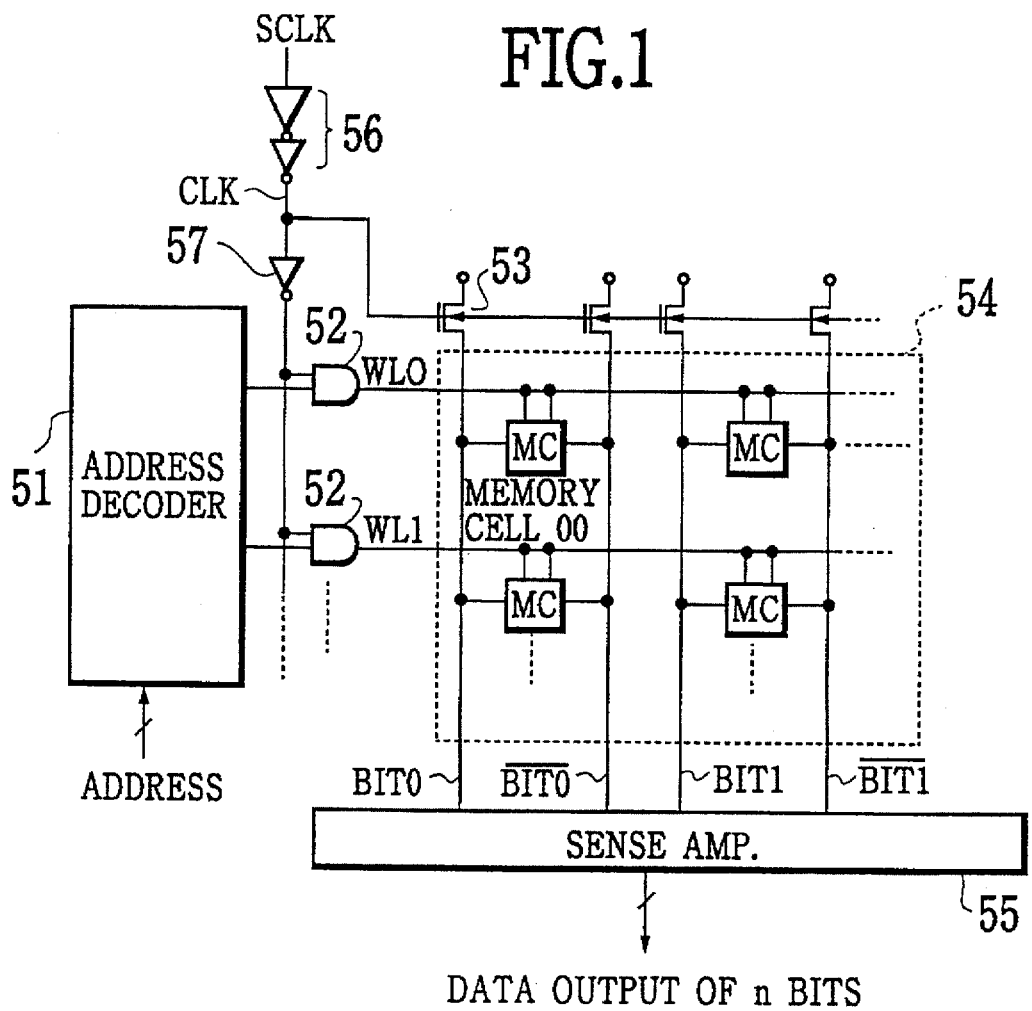
FIG. 1 is a circuit diagram of a conventional precharge type RAM.
Figure 2:
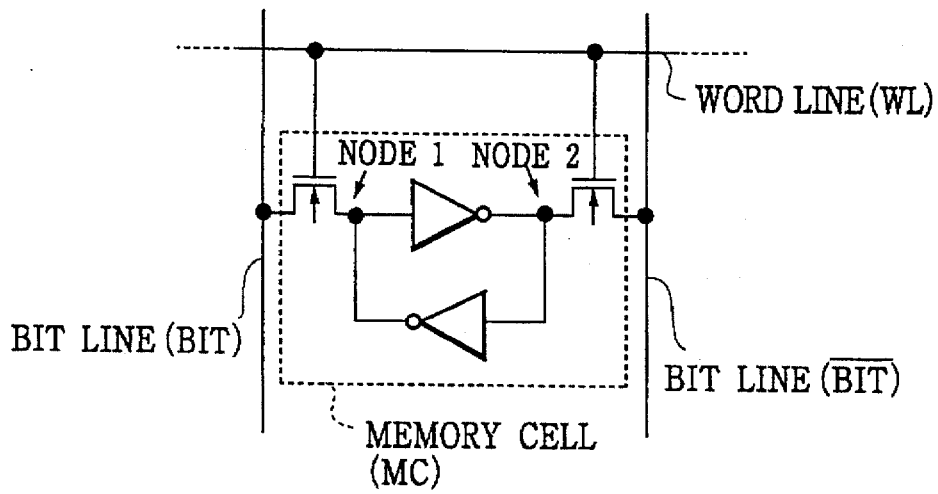
FIG. 2 is a circuit diagram of a memory cell in the conventional precharge type RAM shown in FIG. 1.
Figure 3A:
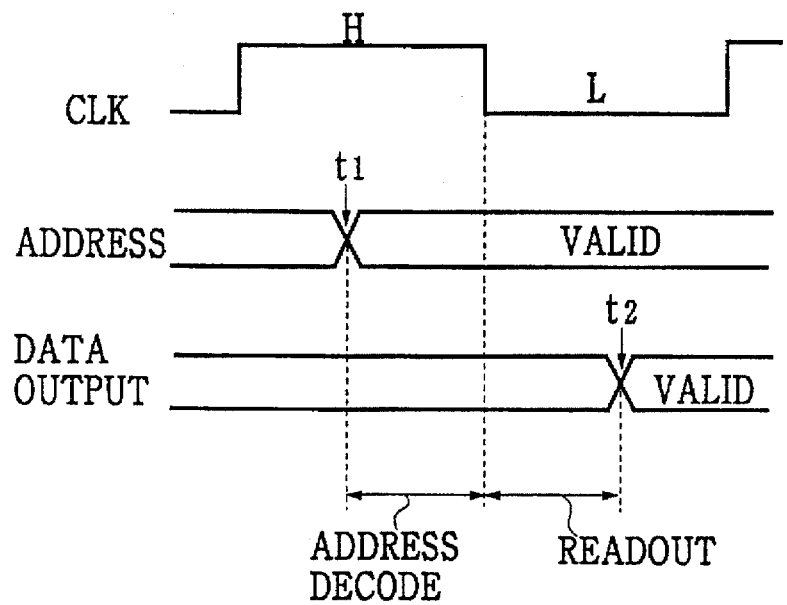
FIGS. 3A and 3B are timing charts showing the operation of the conventional precharge type RAM shown in FIG. 1.
Figure 3B:
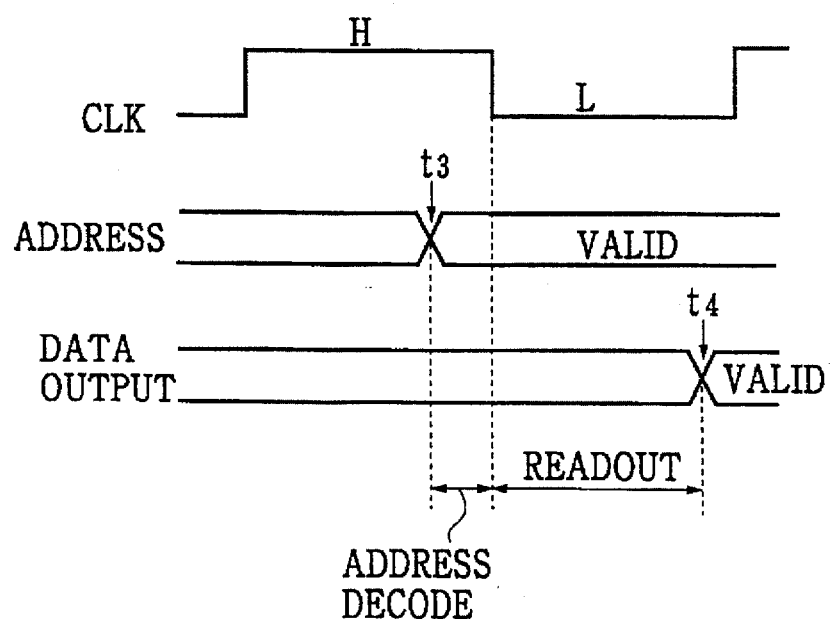
Figure 4:
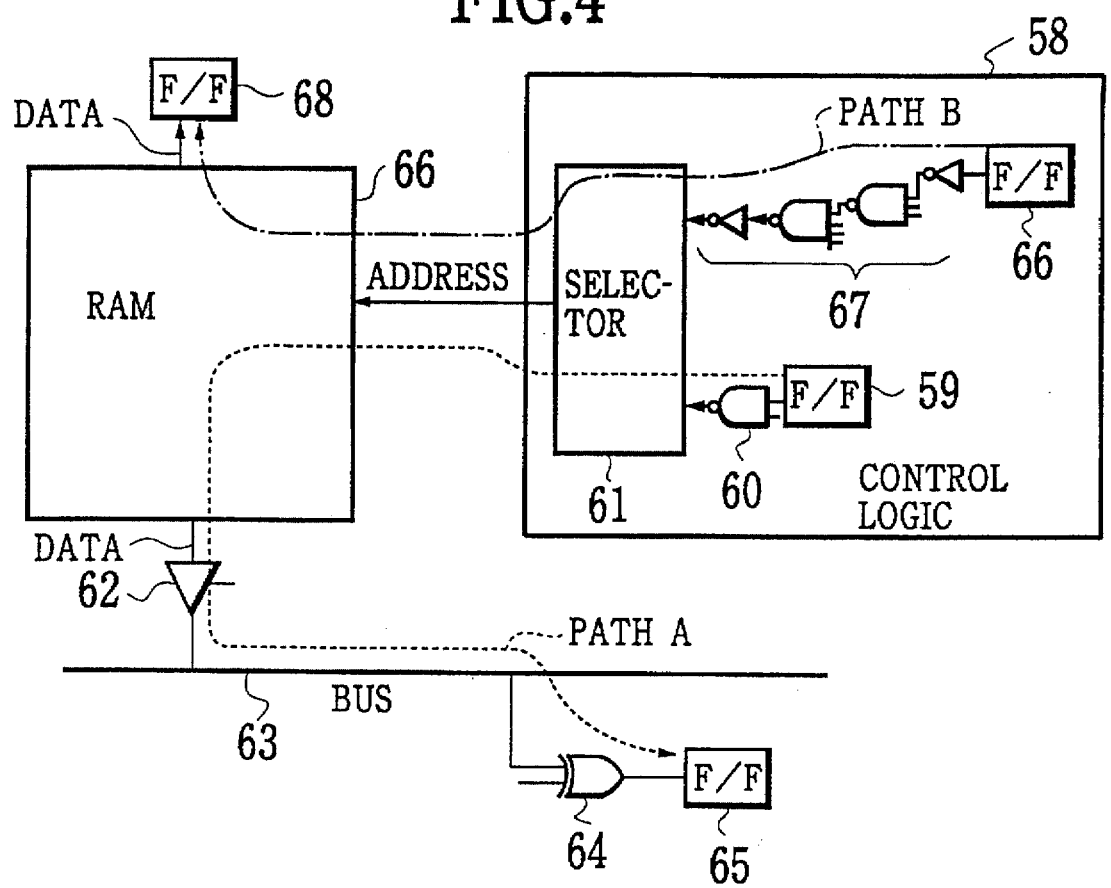
FIG. 4 is a block diagram showing a configuration of the conventional precharge type RAM and peripheral circuits.

The signal ADRTIM indicates whether or not a timing indicating that an address enters an effective state is late. For example, when the timing that an address enters the effective state is late, the signal ADRTIM has a value of "1", which is in the case shown in FIG. 3B. when the timing that an address enters an effective state is not late, the signal ADRTIM has a value of "0", which is in the case shown in FIG. 3A.

Figure 6:
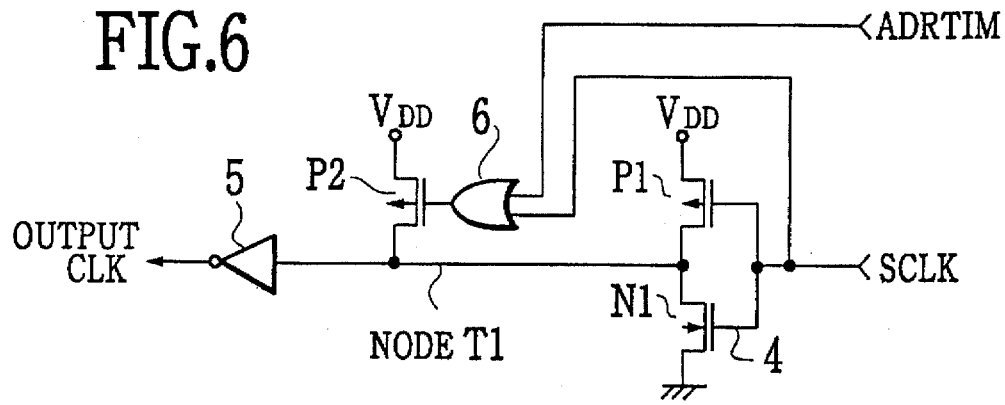
FIG. 6 is a circuit diagram of a clock signal generator as an embodiment, incorporated in the precharge type integrated circuit shown in FIG. 5.

FIG. 6 is a circuit diagram of a preferred configuration of the clock buffer 2 shown in FIG. 5 as an actual embodiment of the present invention.

As shown in FIG. 6, the clock buffer 2 consists of a P channel transistor P1 and a N channel transistor N1, a first inverter 4 receiving a main system clock (SCLK) signal to output an inverted SCLK signal, a second inverter 5 to output a clock (CLK) signal, whose input terminal is connected to an output terminal (or node T1) of the first inverter 4, a P channel transistor P2 connected between a power source $V_{DD}$ and the node T1, and an OR gate 6 whose output controls the operation of the P channel transistor P2.

In this embodiment, the size of the P channel transistor P1 is smaller than that of the P channel transistor P2. These sizes indicate the width "W" of the transistor in the embodiment.

Next, operations of the clock buffer 2 having the configuration shown in FIG. 6 will be now explained.

First, when the ADRTIM=0, same logical value of the SCLK signal is directly output from the OR gate 6. Therefore, when the SCLK signal is in the low level, both of the P channel transistors P1 and P2 are ON, on the other hand, when the SCLK signal is in the high level, both of the p channel transistors P1 and P2 are OFF. According to the change from the high level of the SCLK signal to the low level of the SCLK signal, the node t1 is charged by the P channel transistors P1 and P2, and according to the change from the low level to the high level, the N channel transistor N1 is discharged.

Figure 7A:
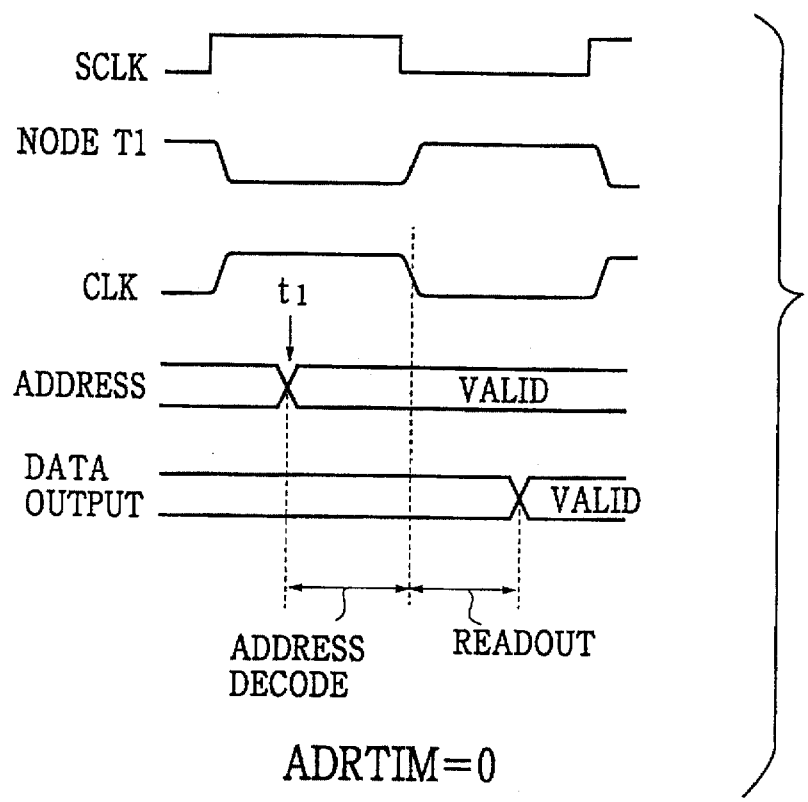
FIGS. 7A and 7B are timing charts showing operation of the clock signal generator shown in FIG. 6.

As shown in FIG. 7A, in order to equal the rising speed and the falling speed of the node T1, the $W_{p1}+W_{p2}$, and $W_{N1}$ are formed respectively. Where, $W_{p1}$ is a greatness of size of the p channel transistor P1. Just as the Wp12, each of $W_{p2}$ and $W_{N1}$ is a greatness of size of the p channel transistor P2 and the n channel transistor $N_1$.

In addition, when the rising time and the falling time are same, the size of the inverter 5 is formed in order to equal the rising time of the CLK signal as the output of the clock buffer 2 to the falling time of the CLK signal. In this case, the wave-form of the CLK signal is shown in FIG. 7A.

Next, we will describe operation of the clock buffer 2 having the configuration of the transistors described above when the ADRTIM is "1".

The output of the OR gate 6 is always "1" because the ADRTIM is "1", and the p channel transistor P2 is always in the OFF state. In this condition, when the SCLK signal changes from the low level to the high level, the electric charges on the node T1 are discharged through the n channel transistor N1. To discharge the electric charges on the node T1 by the n channel transistor N1, just as when the ADRTIM="0" prescribed, the falling time of the node T1 is same when the ADRTIM is "1" and "0".

Figure 7B:
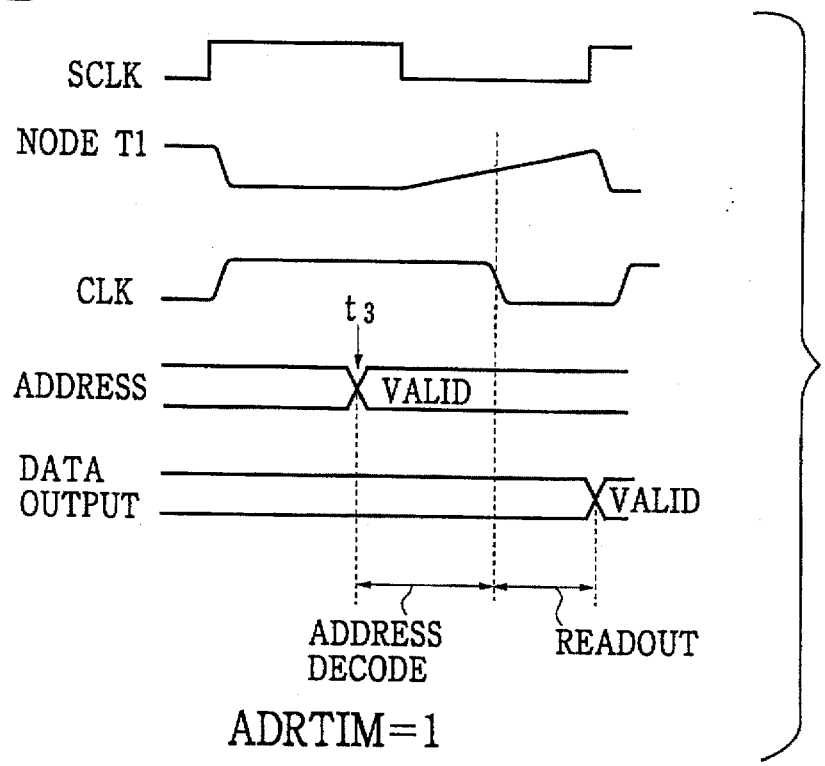

On the contrary, when the change of the SCLK signal from the high level to the low level in the ADRTIM of "1", only the p channel transistor P1 charges the node T1 electrically. As described above, because the p channel transistor P1 is smaller of the p channel transistor P2 in size, the rising speed of the node T1 is increased slowly, as shown in FIG. 7B. Because the output of the second inverter 5 given the electrical potential of node T1 is inverted into the opposite value, when we see that the change time at which the CLK signal as the output of the second inverter 5 changes from the high level to the low level, the change time when the ADRTIM="1" is later in time than when the ADRTIM="0".

As a result, when the ADRTIM is "1", the CLK signal has a longer time period of the high level, and a shorter time period of the low level.

When the speck (1) prescribed is required in the precharge type RAM 1, the clock buffer 2 is executed in the condition of the ADRTIM="0".

Because the CLK signal used in the RAM 1 is provided from the clock buffer 2 with the form shown in FIG. 7A, an appropriate time is provided for address decode operation executed during the high level of the CLK signal and performed readout operation during the low level of the CLK signal.

On the other hand, when the speck (2) prescribed is required for the RAM 1, the clock buffer 2 is performed in the condition of the ADRTIM="1".

The CLK signal used in the RAM 1 is provided with the form shown in FIG. 7B. In this case, comparing the conventional method, there is adequate time for the address decode operation executed while the CLK signal is in the high level because the high level of the CLK signal is longer than the low level of the CLK signal.

On the contrary, there is also adequate time for the readout operation executed while the CLK signal is in the low level in the conventional method prescribed, but, in the embodiment, the readout time is reduced because when the ADRTIM is "1", the falling time of the CLK signal is shifted later.

As a result, whenever the speck (2) is required, it is possible to execute under a safety condition for both of the address decode operation and the readout operation by that the ADRTIM is set as "1", because each of the address decode and the readout operations for the RAM1 has a uniform time period and a reasonable time period in operation.

Figure 8:
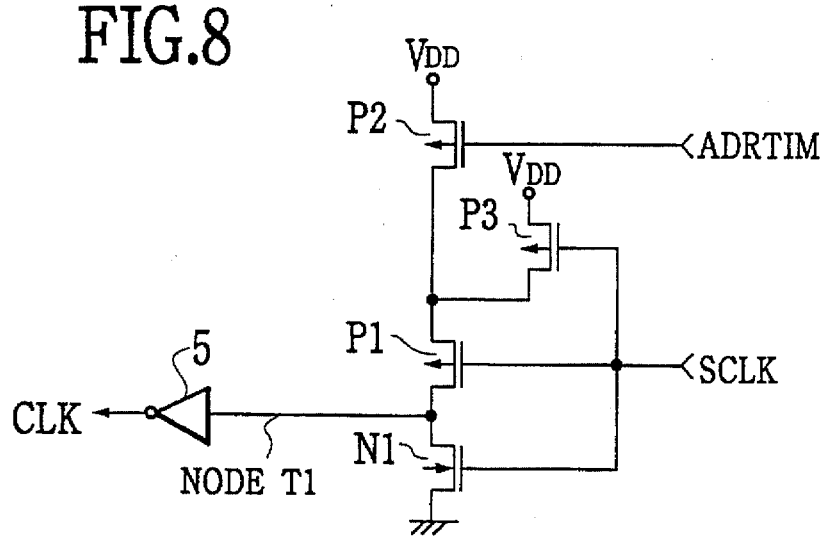
FIG. 8 is a circuit diagram of a clock signal generator as another embodiment according to the present invention.

The clock buffer 2 shown in FIG. 5 can be also realized by using a configuration shown in FIG. 8. Although, it is required with the total 11 transistors to form the clock buffer 2, where, the OR gate is formed with NOR gate formed by CMOSs (made up of four transistors) and an inverter (consisting of two transistors) in the configuration shown in FIG. 6, the clock buffer 2 can be formed with the total of six transistors.

Next, the operation of the clock buffer 2 having the configuration shown in FIG. 8 will now be described below.

In this configuration the size of the p channel transistor P3 is smaller than that of the p channel transistor P2.

First, when the ADRTIM is zero, the p channel transistor P2 is in the ON state regardless of the value of the SCLK. When the SCLK changes from the low level to the high level, the p channel transistor is OFF, and the n channel transistor N1 becomes ON, so that the charges on the node T1 discharge by the N channel transistor N1. The speed of the discharge is proportional to the size of $W_{N1}$.

Next, when the SCLK changes from the high level to the low level, the n channel transistor N1 turns OFF, and the p channel transistors P1 and P2 are ON. Thereby, the node T1 is charged by the p channel transistors P2, P3, and P1. The speed of the charge is proportional to the following equation (1.1):

$$1/((1/W_{P2}+W_{P3})+(1/W_{P1})) \quad (1.1)$$

The speed of the charge is almost equal to the following equation (1.2) because the size ($W_{P3}$) of the p channel transistor P3 is smaller than the size ($W_{P2}$) of the p channel transistor P2, as described above.

$$1/((1/W_{P2})+(1/W_{P1})) \quad (1.2)$$

where, the sizes of $W_{N1}$, $W_{P2}$, and $W_{P1}$ must be set under the condition that the speed of the discharge of the node T1, which is proportional to the $W_{N1}$, is almost equal to the equation (1.2) above.

In addition, when the ADRTIM is zero, the waveform of the node T1 and the CLK signal are shown in FIG. 7A.

Next, the operation of the clock buffer having the size of the transistor shown in FIG. 8 will be described below when the ADRTIM is "1".

The p channel transistor P2 is OFF in spite of the value of the SCLK. When the SCLK changes from the low level to the high level, the charges on the node T1 are discharged by the n channel transistor N1, the speed of the discharge is as same value as the speed of the discharge when the ADRTIM is zero.

ON the contrary, when the SCLK changes from the high level to the low level, only the p channel transistors P8 and P1 are ON (the p channel transistor P2 is OFF). Therefore the speed of the charge at this case is proportional to the following equation.

$$(1/(1/W_{P3})+(1/W_{P1})) \quad (1.3)$$

In this case, when comparing the case that the ADRTIM is "0", the speed of charge is very slow when the ADRTIM is "1" because $W_{P3}$ is appreciably smaller than $W_{P2}$ in size.

The speed of charge when the ADRTIM is "1" is defined by the following equation (1.4).

$$V_1 = k \cdot (1/((1/W_{P3})+(1/W_{P1}))) \quad (1.4)$$

where k means a proportional constant.

The speed of charge when the ADRTIM is "0" is defined by the following equation (1.5).

$$V_0 = k \cdot (1/((1/W_{P2})+(1/W_{P1}))) \quad (1.5)$$

where k means a proportional constant.

A difference between $V_0$ and $V_1$ is obtained by the following equation.

The difference=$V_0 - V_1$ $$\begin{aligned}
&= k \cdot (1/((1/W_{P2}) + (1/W_{P1}))) - \\
&\quad k \cdot (1/((1/W_{P3}) + (1/W_{P1}))) \\
&= k \cdot (W_{P1} \cdot W_{P3}/(W_{P1} + W_{P3})) - \\
&\quad k \cdot (W_{P1} \cdot W_{P2}/(W_{P1} + W_{P2})).
\end{aligned} \quad (1.6)$$

As a result, the node T1 rises slowly when the ADRTIM is "1", and the CLK signal has the wave-form shown in FIG. 7B.

As described above, the configuration of the clock buffer 2 shown in FIG. 8 can obtain the same function of the configuration of that shown in FIG. 6.

Figure 9:
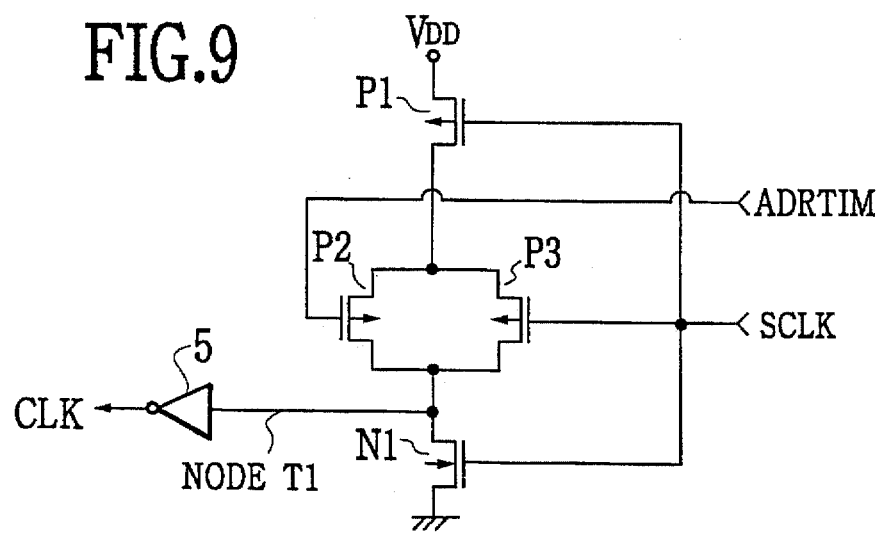
FIG. 9 is a circuit diagram of a clock signal generator as another embodiment according to the present invention.

The function obtained by the configurations shown FIGS. 6 and 8 can be also realized by a configuration shown in FIG. 9.

In a feature of the configuration of the clock buffer 2 shown in FIG. 9, the p channel transistor P1 shown in FIG. 8 is placed at the power source side, and the parallel connection of the p channel transistors P2 and P3 are formed at the node T1 side.

We describe only the case of the precharge type RAM in detail, but, this invention is not limited to the above descriptions, for example, it can be applicable to a precharge type ROM with the same functions and the same effects.

In addition, the configuration and the methods in the embodiments according to the present invention described above can be applicable to the fields of precharge type integrated circuits and systems including the precharge type integrated circuits.

Figure 10:
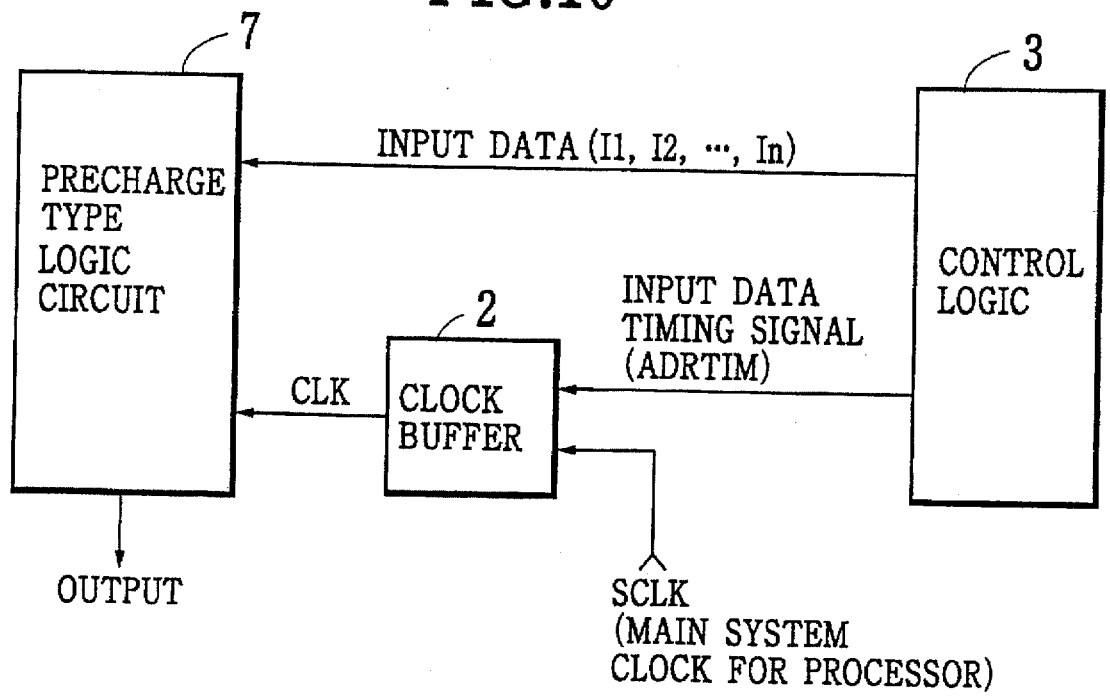
FIG. 10 is a block diagram of a precharge type integrated circuit as another embodiment of the present invention.
Figure 11:
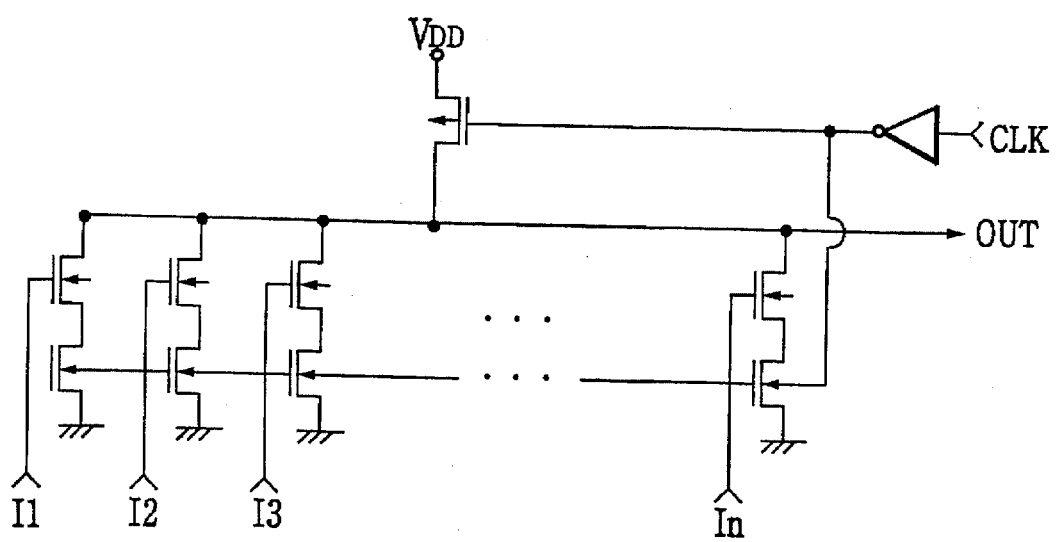
FIG. 11 is a circuit diagram of the precharge type integrated circuit as an embodiment shown in FIG. 10.

FIG. 11 is a circuit configuration diagram for an embodiment of a precharge type integrated circuit 7 in which a precharge type NOR circuit of n inputs and one output is used, as shown in FIG. 10.

In FIG. 11, the NOR circuit has a function to detect whether or not all of n bit inputs (I1, I2, ..., and In) are zero, these inputs affect the condition of output of the precharge type integrated circuit 7.

In other words, an output node OUT is precharged, and a readout is performed while the CLK signal is in the low level while the CLK signal is in the high level. In this case, the output node OUT outputs the high level when the all of the inputs I1, I2, ..., In are "0", and for example, the output node OUT outputs the low level when only one of the all of the inputs I1, I2, ... ,In is "1".

In the circuit having the configuration and the function described above, if the timing that the inputs I1, I2, ..., In enter the valid state is late, for example, when all of the inputs can not enter the valid state while the CLK signal changes from the high level to the low level, the output node OUT outputs error data. In order to avoid the error operation above, there is a method following.

When the timing that the inputs enter the valid state is late, the ADRTIM as the input data timing signal set as "1". On the other hand, when the timing that the inputs enter the valid state is not late, the ADRTIM as the input data timing signal set as "0".

The configurations shown in FIGS. 6, 8, and 9 are applicable to the configuration of the clock buffer 2 shown in FIG. 10.

Figure 12A:
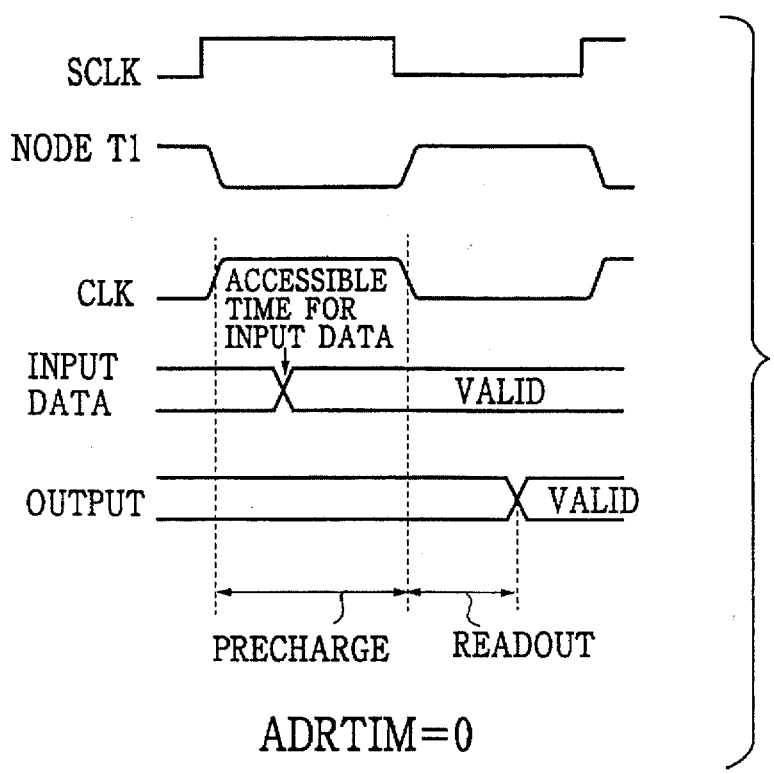
FIGS. 12A and 12B are timing charts showing operations of the clock signal generator shown in FIG. 10 as another embodiment according to the present invention.
Figure 12B:
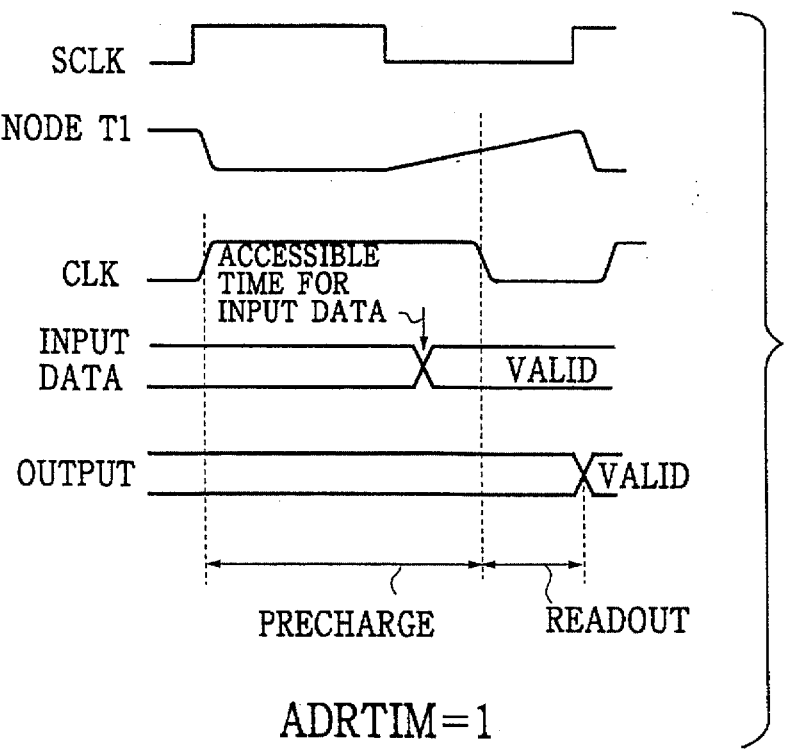

Thus, when the input data timing signal ADRTIM is "0", the wave-form shown in FIG. 12A is obtained. On the contrary, when the ADRTIM is "1", the wave-form shown in FIG. 12B is obtained.

As shown in FIG. 12A, when the ADRTIM is "1", the readout operation can start after all of the input data enter the valid state because the period of the CLK signal of the high level is long. Thus, error operation can be avoided described above. According to the present invention, whenever the timing that all of the input data enter the valid state is late or not, it can be eliminated to happen the error operation.

In the embodiments described above, we describe the configurations which the precharge operation is performed when the clock signal CLK is in the high level, and the readout operation is executed while the CLK signal in the low level.

However, there is another case that the precharge operation is performed when the clock signal CLK is in the low level, and the readout operation is executed while the CLK signal is in the high level.

We will describe another embodiment having the configuration above according to the present invention.

Figure 13:
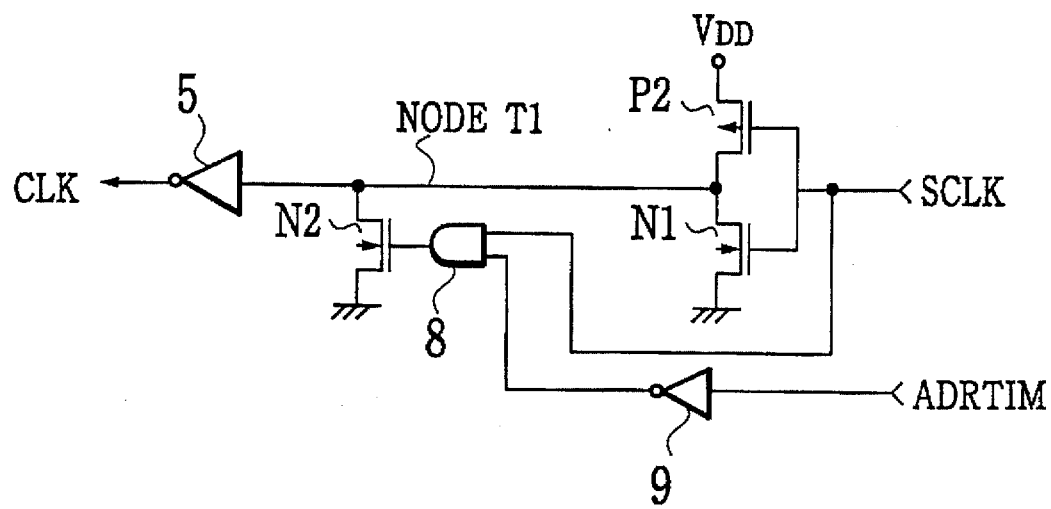
FIG. 13 is a circuit diagram of the clock signal generator as another embodiment according to the present invention.

The case prescribed can be realized with the configuration shown in FIG. 5 in which the circuit configuration shown in FIG. 13 is used as the clock buffer 2.

Here, the operation of the precharge type RAM is described briefly as one example. In the circuit of the clock buffer shown in FIG. 13, the n channel transistor N1 is appreciably smaller than the n channel transistor N2 in size. In addition, the ADRTIM is set as "1" when the timing that an address enters the valid state is late, on the other hand, the ADRTIM is set as "0" when the timing that an address enters the valid state is not late.

First, when the ADRTIM is "0", the node T1 is discharged through the n channel transistors N1 and N2 when the SCLK signal changes from the low level to the high level because the output of the AND gate 8 outputs the same logic value of the SCLK signal.

In addition, the node T1 is discharged through the p channel transistor P1 when the SCLK signal changes from the high level to the low level.

Figure 14A:
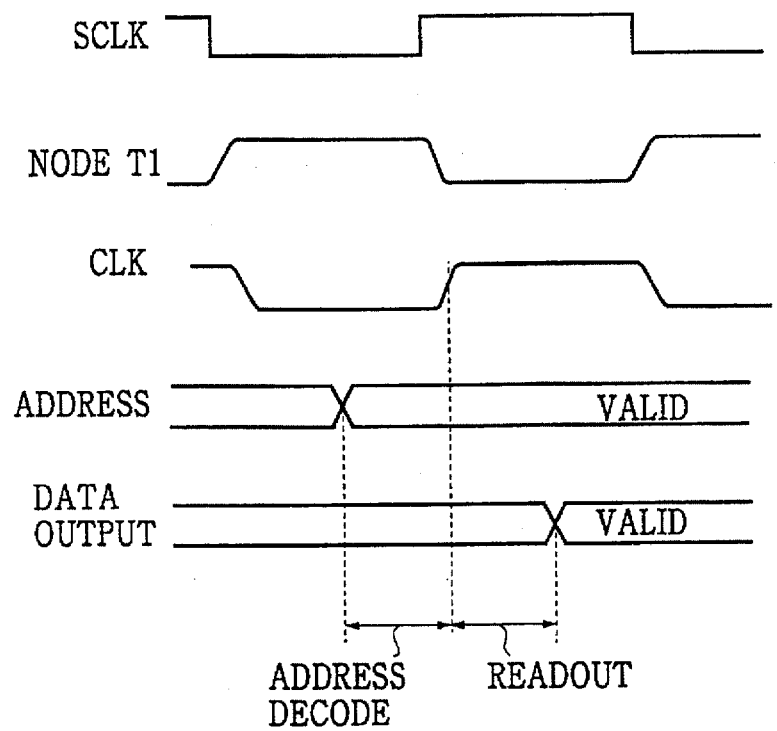
FIGS. 14A and 14B are timing charts of operation of the clock signal generator shown FIG. 13.

The sizes of $(W_{N1}+W_{N2})$ and $W_{P1}$ are formed in order to equal the speed of the charge of the node T1 with the speed of the discharge of the node T1. The wave forms shown in FIG. 14A is obtained at the node T1 and the CLK signal.

On the other hand, when the ADRTIM is "1", the output "0" of the third inverter 9 is transmitted to the input terminal of the AND gate 8, the output of the AND gate 8 become the low level in spite of the value of the SCLK signal, so that the n channel transistor N2 is OFF. The charges of the node T1 are discharged only through the n channel transistor N1.

Figure 14B:
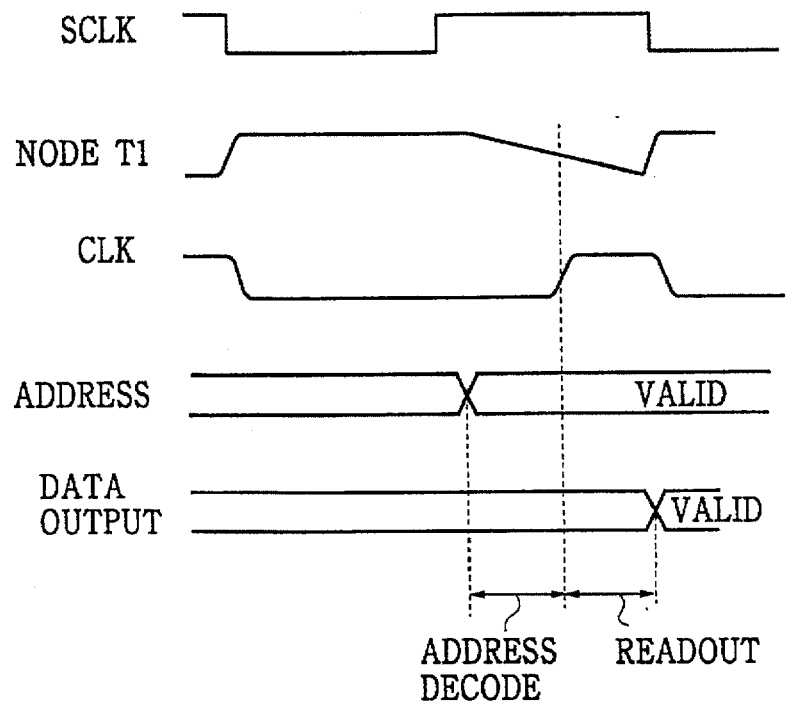

In this case, the n channel transistor N1 is appreciably smaller than that of the n channel transistor N2 in size, the node T1 is discharged slowly shown in FIG. 14B. Thus, the timing of the change of the output from the inverter 5 which inputs the electric potential of the node T1 is shifted appreciably later. The speed of the charge of the node T1 is same when the ADRTIM is "0".

As a result, when the ADRTIM is "1", as shown in FIG. 14B, the CLK signal becomes a clock pulse that the period of the low level of the CLK signal is long, and the period of the high level becomes short. Thus, even if the period of the low level of the CLK signal is long, the address decode operation is performed safety because the period of the low level of the CLK signal is long.

As described above, the ADRTIM is set as "1" when the address timing that an address to be accessed enters the valid state is late, the ADRTIM is set as "0" when the address timing that an address to be accessed enters the valid state is normal. Therefore an adequate time margin can be provided for the address decode operation and the readout operation.

In the embodiments according to the present invention described above, although the address timing signal ADRTIM is changed dynamically in the internal section of microprocessors or DSPs, it is possible to statically fix the ADRTIM signal at "0" or "1" every application when the present invention is used as a hard macro cell for ASCI.

Figure 15:
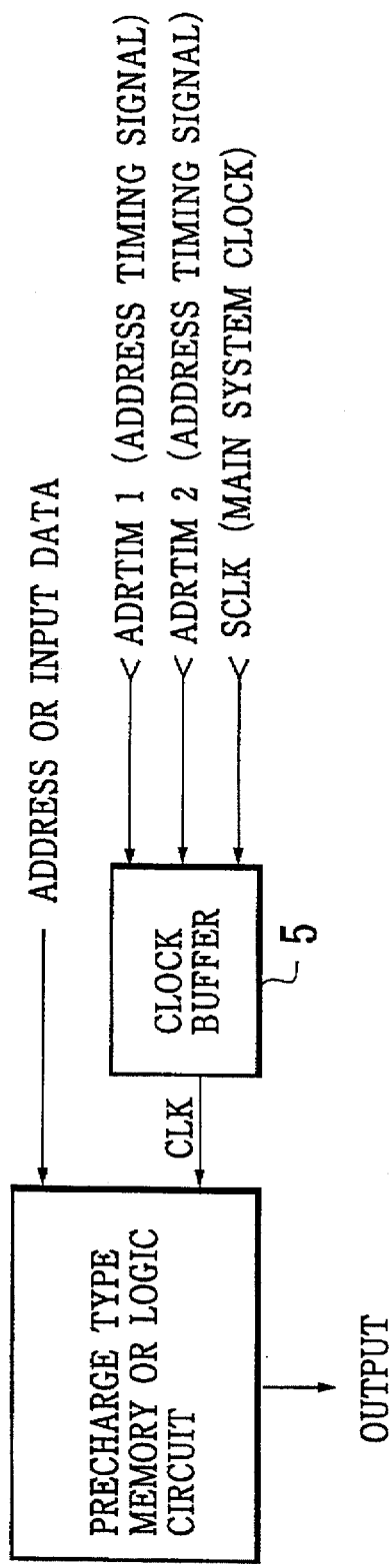
FIG. 15 is a block diagram of a precharge type integrated circuit as another embodiment according to the present invention.

We will describe another embodiment in which the present invention is used to a hard macro cell for a ASCI with referring to FIG. 15.

Figure 17:
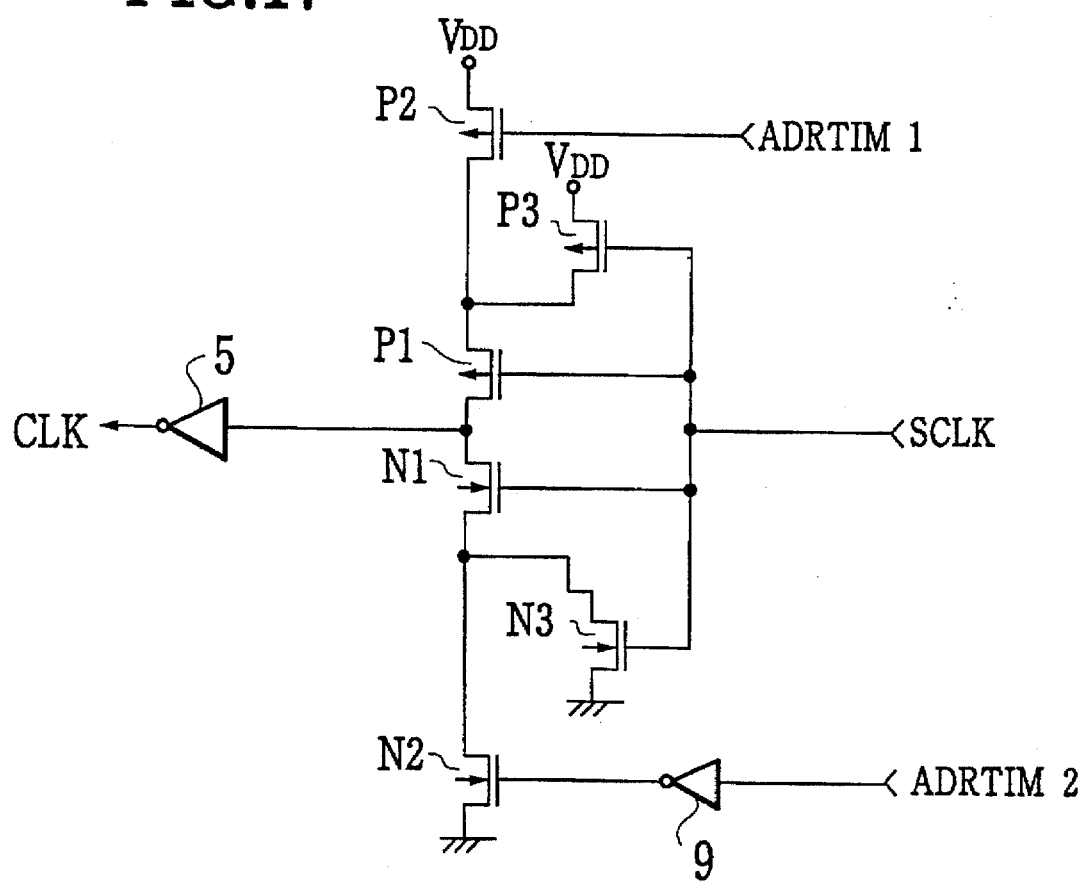
FIG. 17 is a circuit diagram of a clock signal generator as another embodiment according to the present invention.
Figure 16:
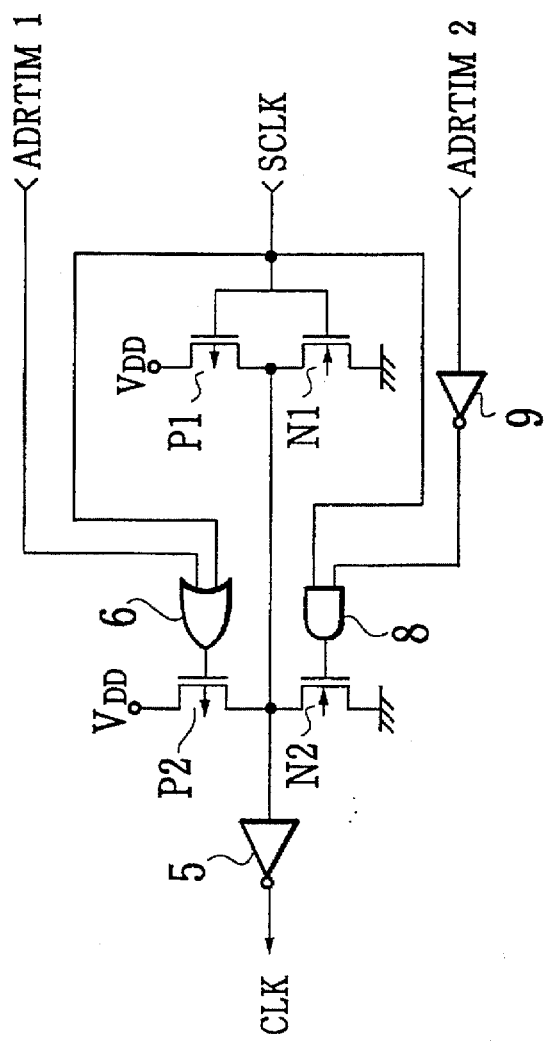
FIG. 16 is a circuit diagram of a clock signal generator as another embodiment according to the present invention.

The configurations of the clock buffer shown in FIG. 15 are shown in FIGS. 16 and 17.

The configuration of the clock buffer shown in FIG. 16 is the combination of the configurations shown in FIGS. 6 and 13. The configuration of the clock buffer shown in FIG. 17 is the combination of the configurations shown in FIGS. 8 and 13. These configurations shown in FIGS. 16 and 17 are same function.

It is required to be applicable to a plurality of applications without the change of the configuration of a hardware or a circuit as the hard macro cell for the ASIC.

According to the embodiments shown in FIGS. 15 to 17, in which the precharge operation is performed in the high level of the CLK signal and the readout operation is executed during the low level of the CLK signal, the first timing signal ADRTIM1="1" and the second timing signal ADRTIM2="0" are used fixedly for an application in which the timing that an address or input data enters the valid state is so late.

In addition, in an application in which the precharge operation is performed in the low level of the CLK signal and the readout operation is executed in the high level of the CLK signal, the first timing signal ADRTIM1="0" and the second timing signal ADRTIM2="1" are used fixedly for an application in which the timing that an address or input data enters the valid state is so late.

On the other hand, the condition that the ADRTIM1 is "0" and the ADRTIM2 is "0" is used for another application excepting the applications described above.

By using the configurations and methods according to the present invention described above, adequate time margins are provided to the address decode operation and the readout operation for each application described above, so that it can execute these operations safety. It is important feature that the functions in the embodiments described above can be realized by switching the address timing signal ADRTIM1 and ADRTIM2 electrically without changing the configurations of the circuits shown in FIGS. 15 to 17.

We describe the embodiments for precharge type integrated circuits described above, but, this invention is not limited to the embodiments above, of course, it can be applicable to predischarge type integrated circuits, for example.

As can be clearly understood from the foregoing description, by using the present invention, without any additional hardware and complicated special circuits, address decode operations and readout operations can be executed correctly under conditions including both of timings that an address to be accessed enters the effective state or the valid state is late or not in time for precharge type memories because the present invention can optimize the distribution of the address decode time and the readout time to perform the address decode operation and the readout operation without difficulty.

Moreover, without any additional hardware and complicated special circuits, address decode operations and readout operations can be executed correctly under conditions including both of timings that an address to be accessed enters the effective state or the valid state is late or not in time for precharge type integrated circuits without causing error operations and difficulty.

The clock signal generators and the precharge or discharge type integrated circuits as the preferred embodiments described above can be applicable to various types of microprocessors, for example a microprocessor based on a pipeline processing.

In particular, we may obtain a greater effect when the precharge type memory circuit is used as a general-purpose register in a microprocessor based on the pipe line processing above.

In the microprocessor of a pipeline processing, for example, when a destination register used for a preceding instruction is same as a source register used for a following instruction, a pipeline hazard such as a hazard of a Read-After-Write (RAW) (hereinafter called as "RAW hazard") is occurred. This RAW hazard shows briefly as follows:

| 1. | Instruction I1   R2 <-- R0 op R1 |
|    | where, R2 is a destination register) |
| 2. | Instruction I2   R5 <-- R2 op R3 |
|    | (where, R2 is a source register) |
| .  | . |
| .  | . | where, "←" means assign operation, and "R0 op R1" indicates an arithmetic or logical operation between the register R0 and R1.

In the RAW hazard above, it must be required to wait the execution of the readout operation for the instruction R2 until the result of a processing of the instruction I1 is stored into the register R2. This means that process operations must be carried out based on a predetermined order described in a program in order to obtain a correct result. In other words, the result of the instruction I1, which is stored in the register R2, must be used for the instruction I2.

Accordingly, if the instruction I2 reads the content of the register R2 before the result of the instruction I1 is stored into the register R2, the error operation will be caused, in this case, an invalid data will be stored in the register R2 for the instruction I2. In other words, the instruction I2 reads a wrong data in the register R2.

In order to avoid the error operation described above, in a conventional microprocessor, the read operation to read the content of the register R2 in the instruction I2 is started in a following cycle after the completion of the instruction I1 in which the result is stored completely into the register R2.

This method can execute the write operation of the instruction I1 and the readout operation of the instruction I2 correctly, but, it causes to lower the performance. This is a problem.

In other words, when compared with a method in which storing into R2 in I1 and readout of R2 in I2 are executed in a same cycle, the readout operation at the instruction I2 must be delayed by one cycle in the conventional method described above. Accordingly, in the conventional method, there is a stall in a pipe line processing. For this reason, the conventional method cannot take advantage of a pipe line processing efficiently.

Recently, a forwarding technique or a bypass technique is reported. The forwarding technique is that data to be written into the general purpose register is also transferred to an arithmetic unit in parallel at the same time, then the arithmetic unit executes an arithmetic operation by using the data which is provided directly to the arithmetic unit.

The forwarding technique can operate without error operations and reducing of a functional effectiveness, but, it requires a special additional hardware to transfer data selectively to the arithmetic unit and its control circuit. Accordingly, the forwarding technique has a demerit of increasing additional hardware. It is the so-called an expensive method. This is also a problem.

The present invention has features by which microprocessors and integrated circuits according to the present invention can execute:

(a) without any error operation for a write operation and a readout operation for a register;

(b) without reducing the performance in speed; and (c) without increasing of a hardware.

We will now describe preferred embodiments of the present invention in which we will show that the present invention can be applicable to a microprocessor based on a pipe line processing without any error operation even if a RAW hazard in a pipe line processing is occurred.

Figure 18:
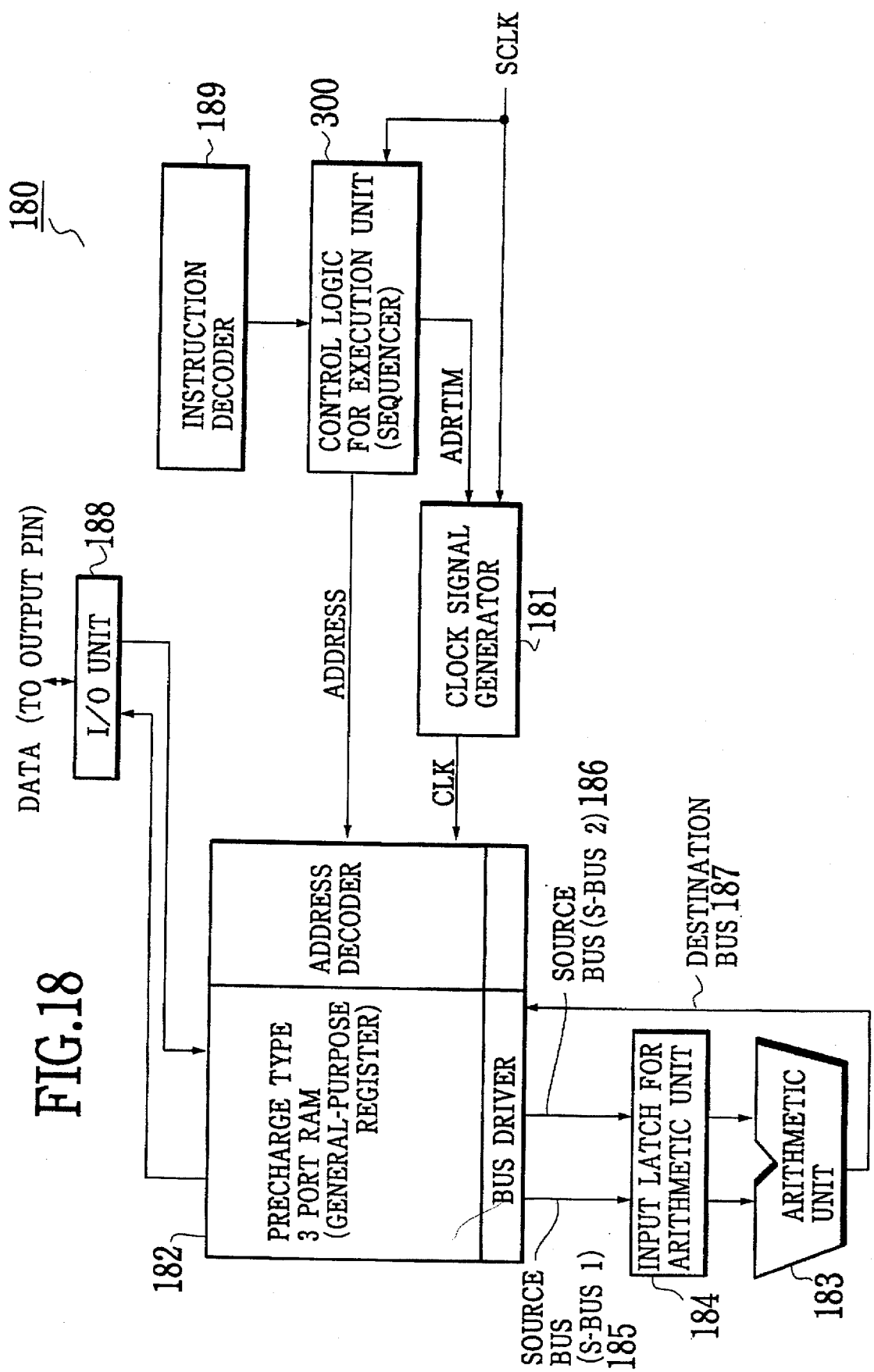
FIG. 18 is a block diagram of a microprocessor as another embodiment of the present invention.

In a system or a microprocessor as a preferred embodiment of the present invention, as shown in FIG. 18, a clock signal buffer 181 and a precharge type memory circuit 182, which have been already described as one of the preferred embodiments according to the present invention, are connected to an arithmetic unit 183, an input latch for the arithmetic unit 183 through source buses 185, 186, and a destination bus 187.

Data read from the precharge type 3 port RAM 182 is transferred through a first source bus 185 to various devices in the microprocessor, for example an I/O unit 188 through which the data is transferred to external devices, an input latch 184 for an arithmetic unit 183.

In a timing of data transfer to units which are separated from the precharge type 3 port RAM 182, It is commonly better to output data read from the RAM 182, as fast as possible. For this reason, as usually, the address timing signal (ADRTIM) to the clock signal generator 181 is used in the low level.

On the contrary, when the RAW pipeline hazard is occurred in the microprocessor 180, the signal ADRTIM is switched to the high level. Thereby, the operation sequence for the read operation to and the readout operation from a register (in this case the RAM 182) can be performed correctly without causing error operations, in addition in a same cycle.

Figure 19:
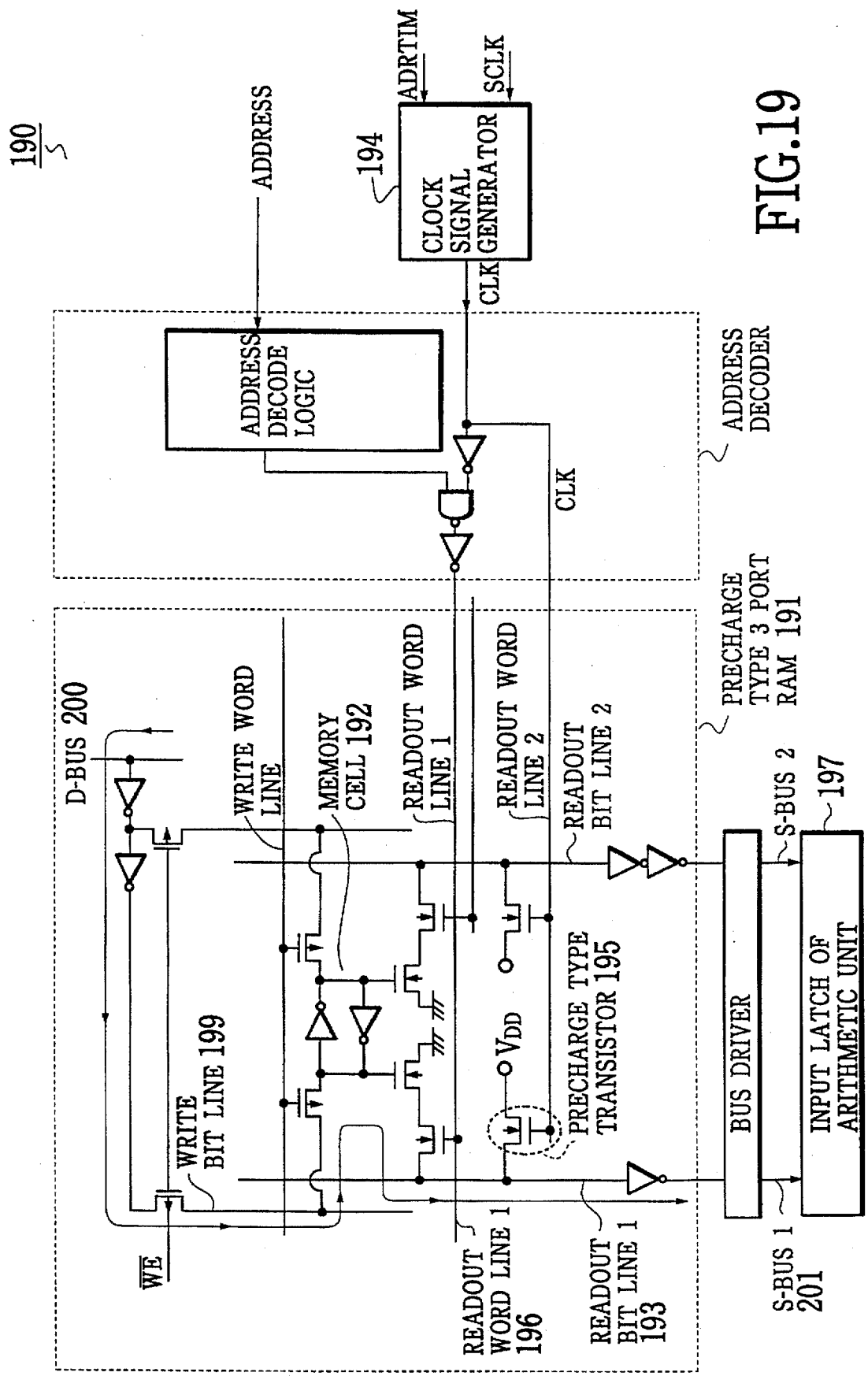
FIG. 19 is a block diagram according to the present invention showing a precharge type 3 port RAM.

We will further describe the operation above in detail. FIG. 19 is a detailed block diagram showing a precharge type 3 port RAM. This RAM has a special pair of readout ports and a write port. In a normal operation, a write timing to the RAM is shown in FIG. 20, in which data to be written becomes valid, i.e., write-data represents valid, in the later half of a system clock SCLK.

The data for the write operation is transferred from a destination bus 200 (D-BUS) to a memory cell 192 (or cross coupled inverters) through a write bit line 199. In the circuit as the embodiment of the present invention, the data written to the memory cell 192 can be read out immediately through the readout bit line 193. The operational principle will be described in detail below.

Figure 20:
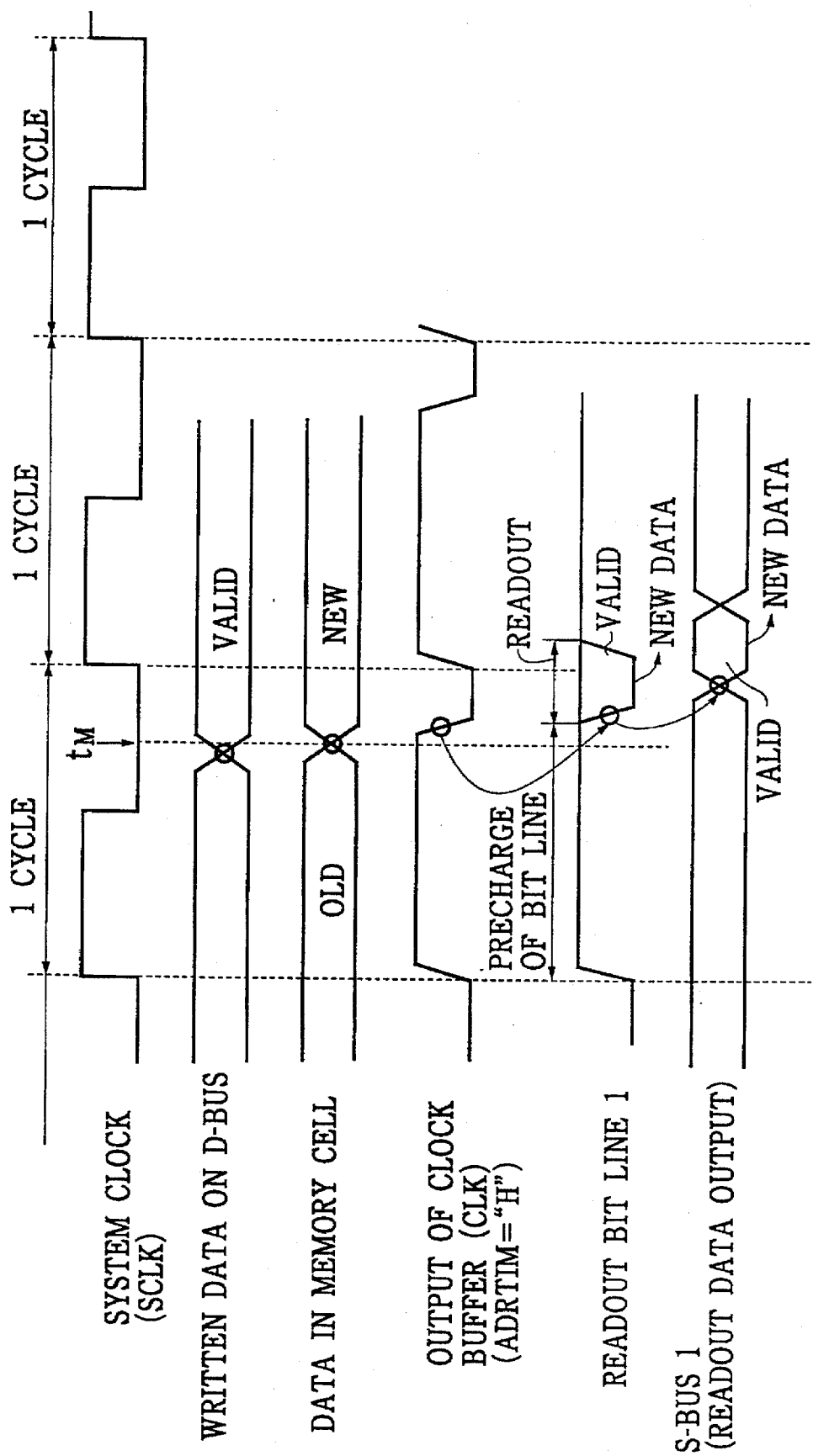
FIG. 20 is a timing chart showing write time to the RAM of FIG. 19.

As shown in FIG. 20, the period of the high level of the clock signal CLK as the output from the clock signal generator 194 becomes long when the signal ADRTIM is in the high level. By adjusting the size of the transistors in the clock signal generator 194, it is set that the timing that the clock signal CLK changes from the high level to the low level is executed after the timing $t_M$ at which the data in the memory cell 191 is re-written.

Because the precharge transistor shown in FIG. 19 is controlled by the clock signal CLK, the readout bit line 193 is precharged as long as the clock signal CLK is in the high level. At the same time, the readout word line 198 is also controlled by the clock signal CLK, the readout word line 196 is kept in the low level as long as the clock signal CLK is in the high level.

When the clock signal CLK is changed from the high level to the low level, the precharge transistor 195 turns off, and the readout word line 196 is open, so that the data in the memory cell 192 which has already written is read out on the readout bit line 193 to transfer it to the S-BUS 201. Compared with that when the signal ADRTIM is in the low level, the readout timing to read out the RAM data to the S-BUS 201 is late, but, when the RAW hazard is occurred, at which the data in the RAM is read out during the high level of the signal ADRTIM, in general, an adequate timing is provided for the readout operation because the RAM data is only transferred to the input latch 197 for the arithmetic unit which is incorporated next to the RAM 191, not far away from the RAM 191.

In addition, it is easy to detect the occurrence of the RAW hazard during the decode operation sequentially by the instruction decoder 189 shown in FIG. 18. As shown in FIG. 18, the instruction decoder 189 transfers information to detect the occurrence of the RAW hazard to a control logic 199 for the execution unit 300. Then, the control logic 199 can produce the ADRTIM signal with the control logic for the pipe line. We summaries the feature of the preceding embodiment according to the present invention.

When by using the configuration of the embodiment described above:

(1) The signal ADRTIM is set in the low level in order to read data in a default state that means there is no RAW hazard in a system. In this case, it can be performed to transfer data to hardware sources, (for example, a I/O unit 188), which are far away from the RAM without any difficulty in timing.

(2) The signal ADRTIM is set in the high level in order to read out of the data in a RAM when the occurrence of a RAW hazard in a microprocessor system is detected. In this case, it can be performed to read data in the RAM through a readout bit line in a same cycle.

It can be possible to execute these operations described above only when an integrated system has a configuration in which the combination of the clock signal generator 194 and the precharge type memory circuit 191 is incorporated.

What is claimed is:

1. An integrated circuit, comprising:
   a clock signal generator for outputting a clock signal having variable duty ratios; and
   a storage device connected to said clock signal generator for receiving said clock signal and configured to output data stored therein and to receive data to be stored therein in synchronism with said clock signal,
   wherein said clock signal generator switches the duty ratio of said clock signal in response to a timing selection signal.

2. An integrated circuit comprising:
   a clock signal generator for outputting a clock signal having a duty ratio;
   a storage device connected to said clock signal generator for receiving said clock signal and configured to output data stored therein and to receive data to be stored therein in synchronism with said clock signal,
   wherein said clock signal generator changes the duty ratio of said clock signal in response to a timing selection signal; and wherein said clock signal generator is further comprised of:
      first inverter means for inputting a main clock signal and outputting an inverted main clock signal;
      logical add means for inputting the main clock signal and said timing selection signal indicating an optimum timing of the clock signal to select and output data in the integrated circuit which performs a precharge operation based on the clock signal with respect to the main clock signal;
      a field effect transistor for operating based on output from said logical add means, connected between an output node of said first inverter means and a power source; and
      second inverter means for inputting the output of said first inverter means and outputting said clock signal, having a different duty ratio than the duty ratio of the main clock signal according to the timing selection signal.

3. An integrated circuit comprising:
   a clock signal generator for outputting a clock signal having a duty ratio;
   a storage device connected to said clock signal generator for receiving said clock signal and configured to output data stored therein and to receive data to be stored therein in synchronism with said clock signal,
   wherein said clock signal generator changes the duty ratio of said clock signal in response to a timing selection signal; and wherein said clock signal generator is comprised of:
      first inverter means for inputting a main clock signal and outputting an inverted main clock signal;
      logical add means for inputting the main clock signal and said timing selection signal as a first timing signal indicating an optimum timing of the clock signal, the optimum timing obtained while the main clock signal is in a high level, to select and output data in the integrated circuit which performs a precharge operation based on the clock signal;
      a first field effect transistor for operating based on an output from said logical add means, connected between an output node of said first inverter means and a high level power source;
      third inverter means for inputting a second timing signal indicating an optimum timing of the clock signal, the optimum timing obtained while the main clock signal is in a low level, to select and output data in the integrated circuit which performs the precharge operation based on the clock signal, and then outputting the inverted second timing signal;

logical product means for inputting the main clock signal and the output from the third inverter means;

a second field effect transistor for operating based on an output from said logical product means, connected between an output of said first inverter means and ground; and second inverter means for inputting the output of said first inverter means and outputting the inverted output of said first inverter means, having a different duty ratio than the duty ratio of the main clock signal according to the first and second timing signals.

4. A precharge type integrated circuit, comprising:

clock signal generator means for inputting a main clock signal having a duty ratio and timing signals to indicate optimum timings for selecting and outputting data in an integrated circuit which performs based on a specified clock signal with respect to the main clock signal, and then outputting clock signals having one of two duty ratios different than the main clock signal according to the timing signals input; and precharge type memory means for inputting an address signal and the output from said clock generator means, in which a precharge operation is executed during a high level period or a low level period in the first half of the clock signal transferred from said clock generator means, and a readout operation of data in said memory means selected by the address signal during a low level period or a high level period, respectively, of the latter half of the clock signal.

5. A precharge type integrated circuit, comprising:

clock signal generator means, comprising:

first inverter means for inputting a main clock signal having a duty ratio and outputting an inverted main clock signal, logical add means for inputting the main clock signal and a timing signal indicating an optimum timing of a clock signal to select and output data in a precharge type integrated circuit which performs a precharge operation based on the clock signal with respect to the main clock signal, a field effect transistor for operating based on output from said logical add means, connected between an output node of said first inverter means and a power source, and second inverter means for inputting the output of said first inverter means and outputting an inverted output of said first inverter means, having a different duty ratio than the duty ratio of the main clock signal according to the timing signal; and precharge type memory means for inputting an address signal and the output from said clock signal generator means, in which a precharge operation is executed during a high level period or a low level period in the first half of the clock signal transferred from said clock generator means, and a readout operation of data in said memory means selected by the address signal during a low level period or a high level period of the latter half of the clock signal.

6. A precharge type integrated circuit, comprising:

clock signal generator means, comprising:

first inverter means for inputting a main clock signal having a duty ratio and outputting an inverted main clock signal, logical add means for inputting the main clock signal and a first timing signal indicating an optimum timing of a clock signal, the optimum timing obtained while the main clock signal is in a high level, to select and output data in a precharge type integrated circuit which performs a precharge operation based on the clock signal, a first field effect transistor for operating based on an output from said add means, connected between said first inverter means and a high level power source, third inverter means for inputting a second timing signal indicating an optimum timing of a clock signal, the optimum timing obtained while the main clock signal is in a low level, to select and output data in the precharge type integrated circuit which performs the precharge operation based on the clock signal, and then outputting the inverted second timing signal, logical product means for inputting the main clock signal and the output from the third inverter means, a second field effect transistor for operating based on an output from said logical product means, connected between an output of said first inverter means and ground; and second inverter means for inputting the output of said first inverter means and outputting the inverted output of said first inverter means, having a different duty ratio than the duty ratio of the main clock signal according to the first and second timing signals; and precharge type memory means for inputting address signal and the output from said second inverter means, in which a precharge operation is executed during one of a high level period and a low level period in the first half of the clock signal transferred from said clock generator means, and a readout operation of data in said memory means selected by the address signal during one of a low level period and a high level period, respectively, of the latter half of the clock signal.

7. A precharge type integrated circuit, comprising:

clock signal generator means for inputting a main clock signal having a duty ratio and timing signals to indicate optimum timings for selecting and outputting data in an integrated circuit which performs based on a specified clock signal with respect to the main clock signal, and for outputting clock signals having variable duty ratios different than the main clock signal according to the timing signals; and precharge type memory means for inputting an address signal and the clock signals from said clock signal generator means, in which a precharge operation is executed during a high level period or a low level period in a first half of one of the clock signals output from said clock signal generator means, and a readout operation of data in said precharge type memory means selected by the address signal during the low level period or the high level period of a latter half of the one of the clock signals.

8. A precharge type integrated circuit, comprising:

clock signal generator means, comprising:

first inverter means for inputting a main clock signal and outputting an inverted main clock signal, logical add means for inputting the main clock signal and a timing signal indicating an optimum timing of a clock signal to select and output data in a precharge type integrated circuit which performs a precharge operation based on the clock signal with respect to the main clock signal, a field effect transistor for operating based on output from said logical add means, connected between said first inverter means and a power source, and second inverter means for inputting the output of said first inverter means and outputting an inverted output of said first inverter means, having a different duty ratio than the duty ratio of the main clock signal according to the timing signal; and precharge type logical means for inputting data and the output from said clock signal generator means, in which a precharge operation is executed during a high level period or a low level period in the first half of the clock signal transferred from said clock signal generator means, and a readout operation of data in said logical means selected by the input data during a low level period or a high level period, respectively, of the latter half of the clock signal.

9. A precharge type integrated circuit, comprising:

clock signal generator means, comprising:

first inverter means for inputting a main clock signal having a duty ratio and outputting an inverted main clock signal, logical add means for inputting the main clock signal and a first timing signal indicating an optimum timing of a clock signal, the optimum timing obtained while the main clock signal is in a high level, to select and output data in a precharge type integrated circuit which performs a precharge operation based on the clock signal, a first field effect transistor for operating based on output from said logical add means, connected between said first inverter means and a high level power source, third inverter means for inputting a second timing signal indicating an optimum timing of a clock signal, the optimum timing obtained while the main clock signal is in a low level, to select and output data in the precharge type integrated circuit which performs the precharge operation based on the clock signal, and then outputting the inverted second timing signal, logical product means for inputting the main clock signal and the output from the third inverter means, a second field effect transistor for operating based on an output from said logical product means, connected between an output of said first inverter means and a reference potential; and second inverter means for inputting the output of said first inverter means and outputting the inverted output of said first inverter means, having a different duty ratio than the duty ratio of the main clock signal according to the first and second timing signals; and precharge type logical means for inputting data and the output from said clock signal inverter means, in which a precharge operation is executed during a high level period or a low level period in the first half of the clock signal transferred from said clock signal generator means, and a readout operation of data in said logical means selected by the input data during a low level period or a high level period of the latter half of the clock signal.

10. An integrated circuit, comprising:

a clock signal generator for outputting a clock signal having one of two duty ratios; and a storage device connected to said clock signal generator for receiving said clock signal and configured to output data stored therein and to receive data to be stored therein in synchronism with said clock signal, wherein said clock signal generator switches the duty ratio of said clock signal in response to a timing selection signal.

11. An integrated circuit, comprising:

a clock signal generator capable of outputting one of a first clock signal having former and latter periods with a first duty ratio and a second clock signal having former and latter periods with a second duty ratio different than said first duty ratio in response to a timing selection signal;

a storage device connected to said clock signal generator for receiving an address and said one of said first and second clock signals and capable of outputting data stored therein and receiving data to be stored therein in said latter periods of said one of said first and second clock signals output from said clock signal generator; and a control logic connected to said clock signal generator for controlling said clock signal generator to output said one of said first and second clock signals to said storage device by supplying said timing selection signal.

12. The integrated circuit as claimed in claim 11, wherein said storage device is a precharge-type RAM.

13. The integrated circuit as claimed in claim 12, wherein said one of said first and second clock signals is provided to said storage device in order that a first time period of said one of said first and second clock signals is defined for decoding an address while a remaining second time period of said one of said first and second clock signals is defined for outputting data from a location of said precharge-type RAM as determined by said address.

* * * * *